(12) United States Patent
Qiang et al.

(10) Patent No.: US 11,121,257 B2
(45) Date of Patent: Sep. 14, 2021

(54) THIN FILM TRANSISTOR, PIXEL STRUCTURE, DISPLAY DEVICE AND MANUFACTURING METHOD

(71) Applicant: BOE TECHNOLOGY GROUP CO., LTD., Beijing (CN)

(72) Inventors: Zhaohui Qiang, Beijing (CN); Feng Guan, Beijing (CN); Zhi Wang, Beijing (CN); Yupeng Gao, Beijing (CN); Yang Lyu, Beijing (CN); Chao Li, Beijing (CN); Jianhua Du, Beijing (CN); Lei Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/641,078

(22) PCT Filed: Feb. 22, 2019

(86) PCT No.: PCT/CN2019/075859
§ 371 (c)(1),
(2) Date: Feb. 21, 2020

(87) PCT Pub. No.: WO2020/168550
PCT Pub. Date: Aug. 27, 2020

(65) Prior Publication Data
US 2021/0028315 A1    Jan. 28, 2021

(51) Int. Cl.
*H01L 29/786*    (2006.01)
*H01L 29/417*    (2006.01)
(Continued)

(52) U.S. Cl.
CPC .. *H01L 29/78636* (2013.01); *H01L 29/41733* (2013.01); *H01L 29/458* (2013.01);
(Continued)

(58) Field of Classification Search
CPC ............ H01L 29/78636; H01L 29/458; H01L 29/78618; H01L 29/41733; H01L 29/66765; H01L 29/78696; H01L 29/4908
See application file for complete search history.

(56) References Cited

U.S. PATENT DOCUMENTS

2004/0142516 A1\* 7/2004 Lee ..................... H01L 29/4908
438/149
2004/0232495 A1\* 11/2004 Saito ................. H01L 29/42384
257/382

(Continued)

FOREIGN PATENT DOCUMENTS

| CN | 102655095 A | 9/2012 |
| CN | 102983135 A | 3/2013 |
| CN | 105762112 A | 7/2016 |

*Primary Examiner* — Mohammed R Alam
(74) *Attorney, Agent, or Firm* — The Webb Law Firm

(57) ABSTRACT

The present disclosure provides a thin film transistor, a pixel structure, a display device, and a manufacturing method. The thin film transistor includes: a gate on the substrate; a gate insulating layer covering the gate and the substrate; a first support portion and a second support portion, which are provided on the gate insulating layer covering the substrate and located on both sides of the gate, wherein the first support portion is not connected to the second support portion; a semiconductor layer on the first support portion, the second support portion, and the gate insulating layer covering the gate; and a source and a drain respectively connected to the semiconductor layer. The first support portion and the second support portion are respectively configured to support the semiconductor layer.

17 Claims, 7 Drawing Sheets

(51) Int. Cl.
*H01L 29/45* (2006.01)
*H01L 29/66* (2006.01)
*H01L 29/49* (2006.01)

(52) U.S. Cl.
CPC .. *H01L 29/66765* (2013.01); *H01L 29/78618* (2013.01); *H01L 29/78696* (2013.01); *H01L 29/4908* (2013.01)

(56) References Cited

U.S. PATENT DOCUMENTS

| | | | |
|---|---|---|---|
| 2010/0193782 A1* | 8/2010 | Sakata | H01L 29/7869 257/43 |
| 2012/0309136 A1 | 12/2012 | Zhou et al. | |
| 2016/0307919 A1* | 10/2016 | Zhang | H01L 27/124 |
| 2018/0122914 A1 | 5/2018 | Li et al. | |

* cited by examiner

THIN FILM TRANSISTOR, PIXEL STRUCTURE, DISPLAY DEVICE AND MANUFACTURING METHOD

CROSS-REFERENCE TO RELATED APPLICATIONS

The present application is a U.S. National Stage Application under 35 U.S.C. § 371 of International Patent Application No. PCT/CN2019/075859, filed on Feb. 22, 2019, the disclosure of which is incorporated by reference herein in its entirety.

TECHNICAL FIELD

The present disclosure relates to a thin film transistor, a pixel structure, a display device, and a manufacturing method.

BACKGROUND

In the field of display technology, it is often necessary to form a thin film transistor on a substrate. For example, the thin film transistor may be connected to a light emitting device as a driving transistor or the like for the light emitting device.

SUMMARY

According to an aspect of embodiments of the present disclosure, a thin film transistor is provided. The thin film transistor is provided on a substrate. The thin film transistor comprises: a gate on the substrate; a gate insulating layer covering the gate and the substrate; a first support portion and a second support portion, which are provided on the gate insulating layer covering the substrate and located on both sides of the gate, wherein the first support portion is not connected to the second support portion; a semiconductor layer on the first support portion, the second support portion, and the gate insulating layer covering the gate; and a source and a drain each connected to the semiconductor layer; wherein the first support portion and the second support portion each are configured to support the semiconductor layer.

In some embodiments, surfaces on a side of the first support portion and the second support portion facing away from the substrate are flush with a surface on a side of a portion of the gate insulating layer on the gate facing away from the substrate; and the first support portion and the second support portion are provided at a step formed by the gate insulating layer on both sides of the gate, and extending directions of the first support portion and the second support portion are the same as that of the semiconductor layer.

In some embodiments, an orthographic projection of the semiconductor layer on the substrate is located inside an orthographic projection of the gate, the first support portion, and the second support portion on the substrate.

In some embodiments, the source is above the first support portion, and the drain is above the second support portion.

In some embodiments, materials of the first support portion and the second support portion comprise a conductive material, the first support portion serves as the source, and the second support portion serves as the drain.

In some embodiments, the conductive material comprises a metal material; and a solid solution of a metal and a semiconductor material is formed in areas where the first support portion and the second support portion are in contact with the semiconductor layer respectively.

In some embodiments, the metal material comprises aluminum; a material of the semiconductor layer comprises polysilicon; and the solid solution is a solid solution of silicon and aluminum.

In some embodiments, a material of the gate insulating layer comprises MgO.

According to another aspect of embodiments of the present disclosure, a pixel structure is provided. The pixel structure comprises the thin film transistor as described previously.

According to another aspect of embodiments of the present disclosure, an array substrate is provided. The array substrate comprises the thin film transistor as described previously.

According to another aspect of embodiments of the present disclosure, a display device is provided. The display device comprises: the array substrate as described previously.

According to another aspect of embodiments of the present disclosure, a manufacturing method for a thin film transistor is provided. The manufacturing method comprises: forming a gate on a substrate; forming a gate insulating layer covering the gate and the substrate; forming a first support portion and a second support portion on the gate insulating layer covering the substrate and located on both sides of the gate, wherein the first support portion is not connected to the second support portion; forming a semiconductor layer on the first support portion, the second support portion, and the gate insulating layer covering the gate; and forming a source and a drain each connected to the semiconductor layer; wherein the first support portion and the second support portion each are configured to support the semiconductor layer.

In some embodiments, the manufacturing method further comprises: performing an annealing treatment on the semiconductor layer.

In some embodiments, after performing the annealing treatment, the manufacturing method further comprises: doping an area of the semiconductor layer on the first support portion and an area of the semiconductor layer on the second support portion; and forming the source and the drain respectively connected to the semiconductor layer in respective doped areas, wherein the source and the drain respectively form an ohmic contact with the respective doped areas.

In some embodiments, materials of the first support portion and the second support portion comprise a conductive material, the first support portion serves as the source, and the second support portion serves as the drain.

In some embodiments, the conductive material comprises a metal material; before performing the annealing treatment on the semiconductor layer, a material of the semiconductor layer comprises amorphous silicon; and the performing the annealing treatment on the semiconductor layer comprises: annealing the semiconductor layer by a laser annealing process to convert the amorphous silicon into polysilicon, wherein, by the laser annealing process, a solid solution of a metal and a semiconductor material is also formed in areas where the first support portion and the second support portion are in contact with the semiconductor layer respectively so as to form an ohmic contact.

In some embodiments, the metal material comprises aluminum; and the solid solution is a solid solution of silicon and aluminum.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
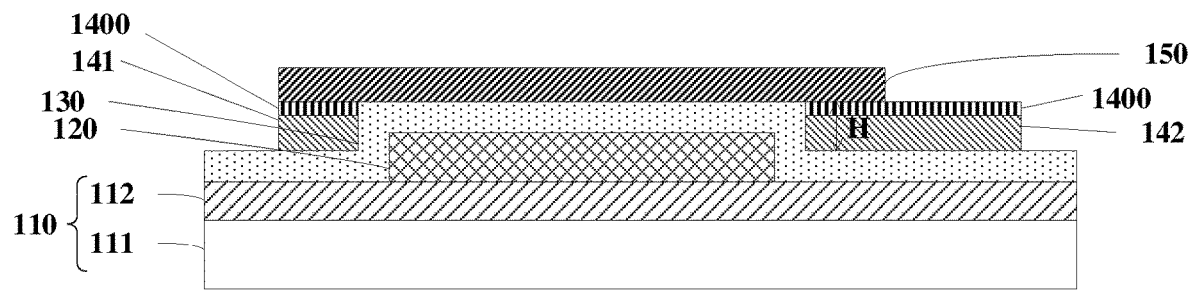
FIG. 1 is a schematic cross-sectional view showing a thin film transistor according to an embodiment of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors of the present disclosure have found that, in the related art, during the process of forming a thin film transistor having a bottom gate structure, a patterned gate may cause a gate insulating layer to have a height difference. During the process of forming a semiconductor layer (e.g., an amorphous silicon layer) on the gate insulating layer, a portion of the semiconductor layer is at a position of the height difference. This height difference does not facilitate crystallization of the semiconductor layer, thereby affecting the performance of the formed thin film transistor.

In view of this, the embodiments of the present disclosure provide a thin film transistor to improve the crystallization effect of a semiconductor layer. Hereinafter, a thin film transistor according to some embodiments of the present disclosure will be described in detail in conjunction with the accompanying drawings.

FIG. 1 is a schematic cross-sectional view showing a thin film transistor according to an embodiment of the present disclosure.

For example, as shown in FIG. 1, the thin film transistor is provided on a substrate 110. In some embodiments, the substrate 110 may comprise an initial substrate 111 and a buffer layer 112 on the initial substrate 111. For example, the initial substrate 111 may comprise a glass substrate or the like. For example, the buffer layer 112 may comprise at least one of a silicon nitride layer or a silicon dioxide layer. For example, the thickness of the silicon nitride layer may range from 30 nm to 80 nm, and the thickness of the silicon dioxide layer may range from 300 nm to 800 nm. In other embodiments, the substrate 110 may comprise the initial substrate 111 without the buffer layer 112.

As shown in FIG. 1, the thin film transistor comprises a gate 120 on the substrate 110. For example, a material of the gate 120 may comprise a metal material such as molybdenum (Mo). A thickness of the gate 120 may range from 2500 Å to 3500 Å.

As shown in FIG. 1, the thin film transistor further comprises a gate insulating layer 130 covering the gate 120 and the substrate 110. A portion of the gate insulating layer 130 on the substrate 110 is integral with a portion of the gate insulating layer 130 on the gate 120. For example, a thickness of the gate insulating layer may range from 100 nm to 500 nm. As shown in FIG. 1, the gate 120 causes the gate insulating layer 130 to have a height difference H.

As shown in FIG. 1, the thin film transistor further comprises a first support portion 141 and a second support portion 142, which are provided on the gate insulating layer 130 covering the substrate 110 and located on both sides of the gate 120, wherein the first support portion 141 is not connected to the second support portion 142. The first support portion 141 and the second support portion 142 are on the portion of the gate insulating layer 130 on the substrate 110. The first support portion 141 and the second support portion 142 are respectively on both sides of the gate 120. For example, the first support portion 141 and the gate 120 are separated by the gate insulating layer 130, and the second support portion 142 and the gate 120 are separated by the gate insulating layer 130. The first support portion 141 and the second support portion 142 may reduce the height difference H.

As shown in FIG. 1, the thin film transistor further comprises a semiconductor layer 150 on the first support portion 141, the second support portion 142, and the gate insulating layer 130 covering the gate 120. The semiconductor layer 150 is on a side of the first support portion 141, the second support portion 142 and the gate insulating layer 130 facing away from the substrate 110. For example, a material of the semiconductor layer 150 may comprise amorphous silicon, polysilicon, or the like. For example, the semiconductor layer 150 may be a low-temperature polysilicon material. The first support portion 141 and the second support portion 142 described above each are configured to support the semiconductor layer 150.

The thin film transistor further comprises a source and a drain each connected to the semiconductor layer 150. In some embodiments, materials of the first support portion 141 and the second support portion 142 may comprise a conductive material. For example, the conductive material comprises a metal material (e.g., aluminum (Al) or the like). For example, the first support portion 141 may serve as the source, and the second support portion 142 may serve as the drain. In this embodiment, the first support portion and the second support portion may serve as the source and the drain respectively, so that it is unnecessary to additionally form the source and the drain, and the device structure may be simplified.

So far, the above-described embodiments provide a thin film transistor. The thin film transistor comprises a gate on a substrate. The thin film transistor further comprises a gate insulating layer covering the gate and the substrate. The thin film transistor further comprises a first support portion and a second support portion, which are provided on the gate insulating layer covering the substrate and located on both sides of the gate, wherein the first support portion is not connected to the second support portion. The thin film transistor further comprises a semiconductor layer on the first support portion, the second support portion, and the gate insulating layer covering the gate. The first support portion and the second support portion are respectively configured to support the semiconductor layer. The thin film transistor comprises a source and a drain respectively connected to the semiconductor layer. This embodiment may reduce the height difference of the gate insulating layer caused by the gate. In this way, during the manufacturing process, it is possible to improve the crystallization effect of the semiconductor layer on the first support portion, the second support portion and the gate insulating layer, thereby improving the performance of the thin film transistor.

In some embodiments, in a case where the materials of the first support portion 141 and the second support portion 142 comprise a metal material, as shown in FIG. 1, the first support portion 141 and the second support portion 142 each comprise a solid solution layer 1400 of the metal material and a semiconductor material of the semiconductor layer 150 in areas where the first support portion 141 and the second support portion 142 are in contact with the semiconductor layer 150 respectively. For example, the metal material comprises aluminum (i.e., the materials of the first support portion 141 and the second support portion 142 are aluminum), the semiconductor material of the semiconductor layer comprises polysilicon, and the solid solution layer of the metal material and the semiconductor material is a solid solution layer of silicon and aluminum. The solid solution layer 1400 of the metal material and the semiconductor material may make the first support portion and the second support portion respectively form an ohmic contact with the semiconductor layer, which may reduce the contact resistance, thereby improving the response speed and performance of the device, and reducing the power consumption.

In some embodiments, as shown in FIG. 1, surfaces on a side of the first support portion 141 and the second support portion 142 facing away from the substrate 110 (i.e. upper surfaces of the first support portion 141 and the second support portion 142 in FIG. 1) are flush with a surface on a side of a portion of the gate insulating layer 130 on the gate 120 facing away from the substrate. In FIG. 1, the above-described surface of the portion of the gate insulating layer is a upper surface of the portion of the gate insulating layer 130 on the gate 120. The upper surfaces of the two support portions are flush with the upper surface of the above-described portion of the gate insulating layer, thereby facilitating improving the crystallization effect of the semiconductor layer during the manufacturing process.

It should be noted that, the term "flush" here comprises, but is not limited to, absolute flush. For example, the upper surfaces of the two support portions may be higher or lower than the upper surface of the above-described portion of the gate insulating layer, as long as a height difference between these upper surfaces is within an allowable range. The allowed range may be determined according to actual conditions or actual needs.

It should also be noted that, in some cases, although the upper surfaces of the two support portions may be not flush with the upper surface of the above-described portion of the gate insulating layer, these two support portions may also reduce the height difference H of the gate insulating layer to a certain extent, and thus it is also possible to improve the crystallization effect of the semiconductor layer.

In some embodiments, the first support portion 141 and the second support portion 142 are provided at a step formed by the gate insulating layer 130 on both sides of the gate 120. In other words, the first support portion 141 and the second support portion 142 are provided at a step formed by a portion of the gate insulating layer 130 on the substrate 110 and a portion of the gate insulating layer 130 on the gate 120. Extending directions of the first support portion 141 and the second support portion 142 are the same as that of the semiconductor layer 150. For example, the semiconductor layer 150 extends along a direction parallel to the substrate, and the first support portion 141 and the second support portion 142 also extend along the direction.

In some embodiments, a thickness of the first support portion 141 and a thickness of the second support portion 142 are 100 nm to 300 nm respectively. Of course, those skilled in the art should understand that, the thickness of the first support portion and the thickness of the second support portion described here are merely exemplary, and the scope of the embodiments of the present disclosure is not limited thereto.

In some embodiments, as shown in FIG. 1, an orthographic projection (not shown) of the semiconductor layer 150 on the substrate 110 is located inside an orthographic projection (not shown) of the gate 120, the first support portion 141, and the second support portion 142 on the substrate 110. In other words, the orthographic projection of the gate 120, the first support portion 141, and the second support portion 142 on the substrate 110 covers the orthographic projection of the semiconductor layer 150 on the substrate 110.

In some embodiments, as shown in FIG. 1, a portion of the second support portion 142 is not covered by the semiconductor layer 150. The portion of the second support portion 142 that is not covered may be used to connect to another structure (e.g., an electrode of a light emitting device). In other embodiments, a portion of the first support portion 141 may not be covered by the semiconductor layer 150 (not shown).

In some embodiments, a material of the gate insulating layer 130 may comprise an insulating material having a dielectric constant greater than 3.9. In this embodiment, the gate insulating layer uses a material with a relatively large dielectric constant, which may increase the gate's ability to control the channel, and may change the gray scale under a small voltage change, thereby improving the response speed of the thin film transistor.

For example, the material of the gate insulating layer 130 may comprise MgO or the like. By using for example MgO or the like as the gate insulating layer, in addition to increasing the gate's ability to control the channel to improve the response speed of the thin film transistor, it may also make the gate insulating layer have a better heat insulation performance. In this way, in the process of laser annealing during the manufacturing process, heat radiation may be performed relatively slowly, thereby improving the crystallization effect of the semiconductor layer.

In other embodiments, the material of the gate insulating layer 130 may comprise silicon dioxide or the like.

Figure 2:
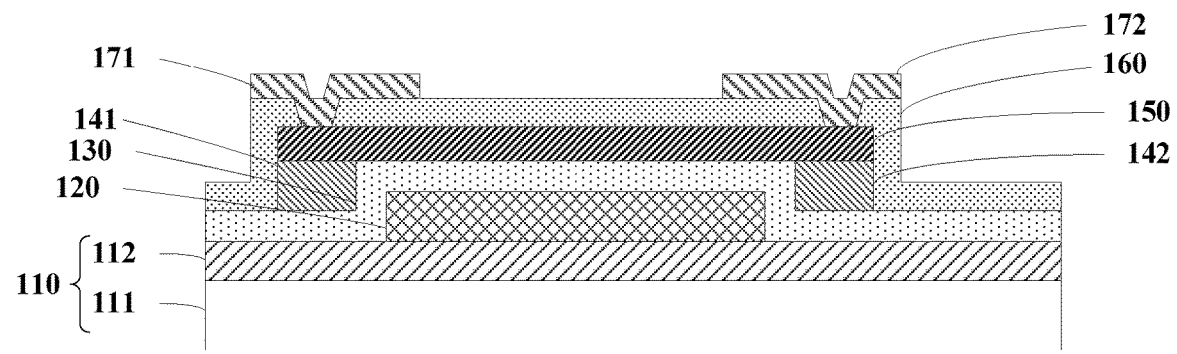
FIG. 2 is a schematic cross-sectional view showing a thin film transistor according to another embodiment of the present disclosure.

FIG. 2 is a schematic cross-sectional view showing a thin film transistor according to another embodiment of the present disclosure. The thin film transistor is provided on the substrate 110.

Similar to the thin film transistor shown in FIG. 1, the thin film transistor shown in FIG. 2 comprises: the gate 120, the gate insulating layer 130, the first support portion 141, the second support portion 142, and the semiconductor layer 150. As shown in FIG. 2, the thin film transistor may further comprise a source 171 and a drain 172 respectively connected to the semiconductor layer 150. The source 171 and the drain 172 are respectively on the semiconductor layer 150. The source 171 is above the first support portion 141, and the drain 172 is above the second support portion 142.

In some embodiments, as shown in FIG. 2, the thin film transistor may further comprise an interlevel dielectric layer (ILD) 160. The interlayer dielectric layer 160 covers the gate insulating layer 130, the first support portion 141, the second support portion 142 and the semiconductor layer 150. The source 171 and the drain 172 respectively pass through the interlayer dielectric layer 160 so as to be connected to the semiconductor layer 150.

In the above-described embodiments, a thin film transistor according to other embodiments of the present disclosure is provided. In the thin film transistor, the source and the drain which are respectively connected to the semiconductor layer are provided. This eliminates the need to use the first support portion and the second support portion as the source and the drain respectively.

In the embodiment, since the first support portion and the second support portion may not serve as the source and the drain, the materials of the first support portion and the second support portion may not be limited to a conductive material. For example, the materials of the first support portion and the second support portion may comprise an insulating material such as silicon nitride, silicon dioxide, or the like.

In some embodiments, the above-described thin film transistor may be a PMOS (P-channel Metal Oxide Semiconductor) transistor or an NMOS (N-channel Metal Oxide Semiconductor) transistor.

In some embodiments of the present disclosure, a pixel structure is also provided. The pixel structure may comprise the thin film transistor as described above.

Figure 3:
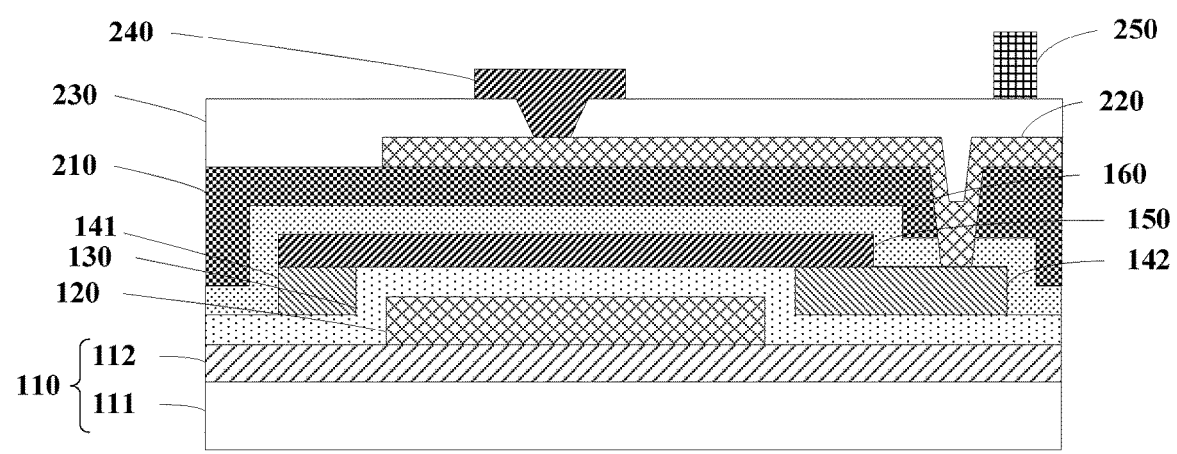
FIG. 3 is a schematic cross-sectional view showing a pixel structure according to an embodiment of the present disclosure.

FIG. 3 is a schematic cross-sectional view showing a pixel structure according to an embodiment of the present disclosure.

As shown in FIG. 3, the pixel structure may comprise the thin film transistor as shown in FIG. 1. For example, the pixel structure may comprise the gate 120, the gate insulating layer 130, the first support portion 141, the second support portion 142, and the semiconductor layer 150.

In some embodiments, the pixel structure may further comprise an electrode (e.g., an anode) 220 connected to the first support portion 141 or the second support portion 142. For example, as shown in FIG. 3, the electrode 220 is connected to the second support portion 142.

In some embodiments, as shown in FIG. 3, the pixel structure may further comprise a functional layer 240 on a side of the electrode 220 facing away from the thin film transistor. For example, the functional layer 240 is on a surface of the electrode 220. For example, the functional layer 240 may comprise an electron transport layer, a hole transport layer, a light emitting layer, and the like. For another example, the functional layer 240 may further comprise an electron blocking layer and a hole blocking layer or the like.

So far, a pixel structure according to some embodiments of the present disclosure is provided. The pixel structure further comprises an electrode and a functional layer in addition to a thin film transistor. The electrode is connected to the first support portion or the second support portion.

In some embodiments, as shown in FIG. 3, the pixel structure may further comprise an interlayer dielectric layer 160. The interlayer dielectric layer 160 covers the gate insulating layer 130, the first support portion 141, the second support portion 142 and the semiconductor layer 150. The pixel structure may further comprise a planarization layer (PLN) 210 on the interlayer dielectric layer 160.

As shown in FIG. 3, the electrode 220 passes through the planarization layer 210 and the interlayer dielectric layer 160 and is connected to the second support portion 142. For example, a portion of the first support portion 141 or a portion of the second support portion 142 is not covered by the semiconductor layer 150. The electrode 220 is connected to the portion of the first support portion 141 that is not covered or the portion of the second support portion 142 that is not covered. FIG. 3 shows that the electrode 220 is connected to the portion of the second support portion 142 that is not covered.

In some embodiments, as shown in FIG. 3, the pixel structure may further comprise a pixel definition layer (PDL) 230 on the planarization layer 210 and the electrode 220. The functional layer 240 passes through the pixel definition layer 230 and is in contact with the electrode 220.

In some embodiments, as shown in FIG. 3, the pixel structure may further comprise a photo spacer (PS) 250 on the pixel definition layer 230.

Figure 4:
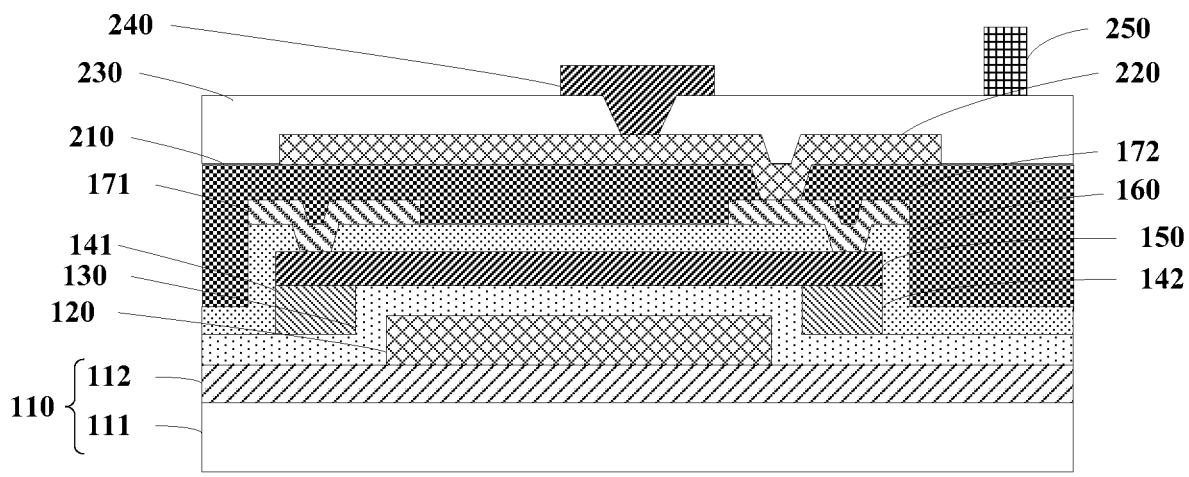
FIG. 4 is a schematic cross-sectional view showing a pixel structure according to another embodiment of the present disclosure.

FIG. 4 is a schematic cross-sectional view showing a pixel structure according to another embodiment of the present disclosure.

As shown in FIG. 4, the pixel structure may comprise the thin film transistor as shown in FIG. 2. For example, the pixel structure comprises the gate 120, the gate insulating layer 130, the first support portion 141, the second support portion 142, the semiconductor layer 150, the interlayer dielectric layer 160, the source 171, and the drain 172.

In some embodiments, the pixel structure may further comprise an electrode (e.g., an anode) 220 connected to the source 171 or the drain 172. For example, as shown in FIG. 4, the electrode 220 is connected to the drain 172.

In some embodiments, as shown in FIG. 4, the pixel structure may further comprise a functional layer 240 on a side of the electrode 220 facing away from the thin film transistor.

So far, a pixel structure according to other embodiments according to the present disclosure is provided. The pixel structure further comprises the electrode and the functional layer in addition to the thin film transistor. The electrode is connected to the source or the drain.

In some embodiments, as shown in FIG. 4, the pixel structure may further comprise a planarization layer 210 covering the interlayer dielectric layer 160, the source 171, and the drain 172. The electrode 220 passes through the planarization layer 210 and is connected to the drain 172. In addition, similar to the pixel structure shown in FIG. 3, the pixel structure shown in FIG. 4 may also comprise the pixel definition layer 230 and the photo spacer 250.

In some embodiments, in the case where the materials of the first support portion 141 and the second support portion 142 are a conductive material, the first support portion 141 or the second support portion 142 respectively forms a capacitor with the gate. In this way, in the above-described pixel structure, a capacitor is also provided, so that it is unnecessary to additionally form a capacitor.

In the case where the gate insulating layer 130 uses an insulating material (e.g., MgO) having a relatively large dielectric constant (e.g., a dielectric constant greater than 3.9), an occupied area of the capacitor may be reduced. This may reduce the total area of the pixel structure, thereby raising the PPI (Pixels Per Inch) of the display panel.

In some embodiments of the present disclosure, an array substrate is also provided. The array substrate may comprise the thin film transistor as described above (e.g., the thin film transistor shown in FIG. 1 or 2). For example, the array substrate may further comprise a substrate.

In some embodiments of the present disclosure, a display device is also provided. The display device comprises the array substrate as described above. For example, the display device may be a display panel, a display, a mobile phone, or a tablet computer and the like.

Figure 5:
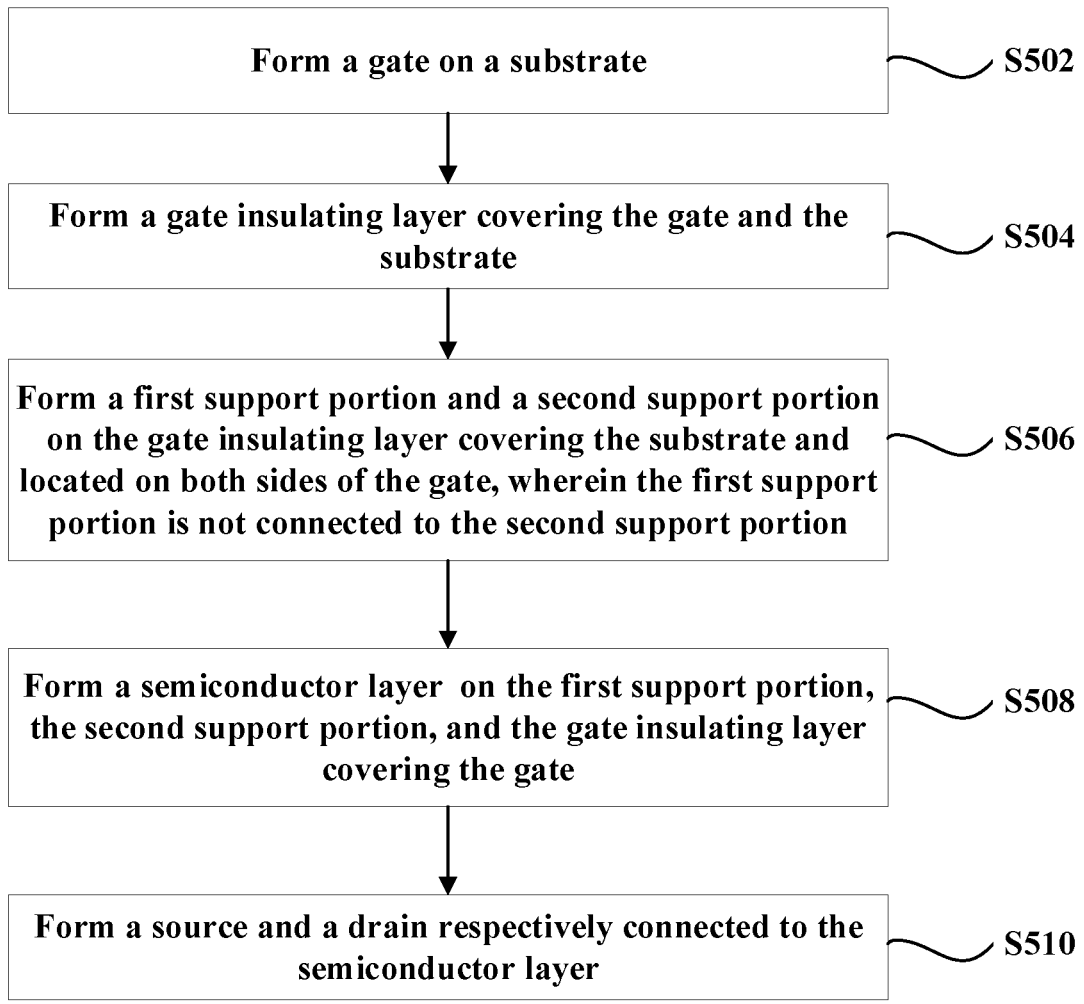
FIG. 5 is a flowchart showing a manufacturing method for a thin film transistor according to an embodiment of the present disclosure.

FIG. 5 is a flowchart showing a manufacturing method for a thin film transistor according to an embodiment of the present disclosure. FIGS. 6, 7, 8, and FIG. 1 are schematic cross-sectional views showing structures of several stages during a manufacturing process of a thin film transistor according to some embodiments of the present disclosure. Hereinafter, a manufacturing process of a thin film transistor according to some embodiments of the present disclosure will be described in detail in conjunction with FIGS. 5, 6, 7, 8, and FIG. 1. As shown in FIG. 5, the manufacturing method may comprise steps S502 to S510.

As shown in FIG. 5, at step S502, a gate is formed on a substrate.

Figure 6:
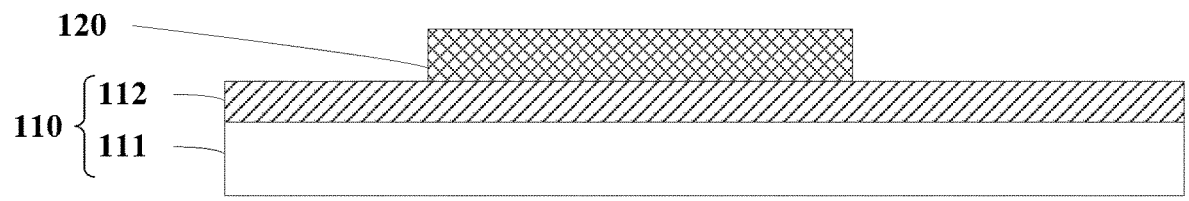
FIG. 6 is a schematic cross-sectional view showing a structure at a stage during a manufacturing process of a thin film transistor according to an embodiment of the present disclosure.

FIG. 6 is a schematic cross-sectional view showing a structure at step S502 during a manufacturing process of a thin film transistor according to an embodiment of the present disclosure. As shown in FIG. 6, a buffer layer 112 is formed on an initial substrate (e.g., a high-temperature glass substrate) 111 by a chemical vapor deposition process. For example, the buffer layer 112 may comprise at least one of a silicon nitride layer or a silicon dioxide layer. For example, a thickness of the silicon nitride layer may range from 30 nm to 80 nm, and a thickness of the silicon dioxide layer may range from 300 nm to 800 nm. Through the above-described process flow, a substrate 110 is formed. The substrate 110 may comprise the initial substrate 111 and the buffer layer 112. Then, for example, a gate material layer (e.g., molybdenum) is formed on the substrate 110 by using a magnetron sputtering technique, and the gate material layer is patterned to form a gate 120. For example, a thickness of the gate 120 may range from 2500 Å to 3500 Å.

Returning to FIG. 5, at step S504, a gate insulating layer covering the gate and the substrate is formed.

Figure 7:
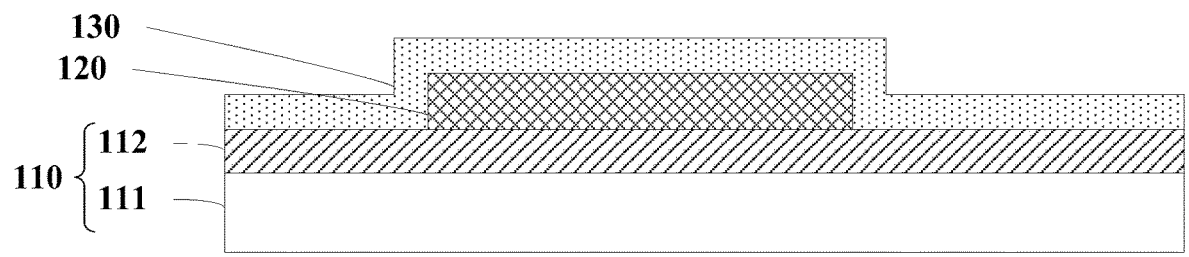
FIG. 7 is a schematic cross-sectional view showing a structure at a stage during a manufacturing process of a thin film transistor according to an embodiment of the present disclosure.

FIG. 7 is a schematic cross-sectional view showing a structure at step S504 during a manufacturing process of a thin film transistor according to an embodiment of the present disclosure. As shown in FIG. 7, for example, a gate insulating layer 130 covering the gate electrode 120 and the substrate 110 is formed by using an electron beam evaporation technique. A portion of the gate insulating layer 130 on the substrate 110 and a portion of the gate insulating layer 130 on the gate 120 are integrally formed. For example, a material of the gate insulating layer may comprise MgO or the like. For example, a thickness of the gate insulating layer may range from 100 nm to 500 nm.

Returning to FIG. 5, at step S506, a first support portion and a second support portion are formed on the gate insulating layer covering the substrate and located on both sides of the gate, wherein the first support portion is not connected to the second support portion.

Figure 8:
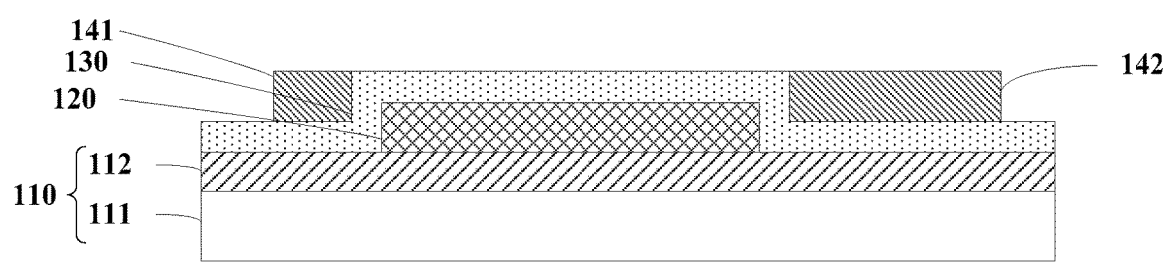
FIG. 8 is a schematic cross-sectional view showing a structure at a stage during a manufacturing process of a thin film transistor according to an embodiment of the present disclosure.

FIG. 8 is a schematic cross-sectional view showing a structure at step S506 during a manufacturing process of a thin film transistor according to an embodiment of the present disclosure. As shown in FIG. 8, a first support portion 141 and a second support portion 142 are formed on the gate insulating layer 130 covering the substrate 110 and located on both sides of the gate 120, wherein the first support portion 141 is not connected to the second support portion 142.

For example, a mask may be formed on the gate insulating layer 130, wherein the mask exposes a portion of the gate insulating layer 130 (i.e., a portion on which the first support portion and the second support portion need to be formed). The first support portion 141 and the second support portion 142 are then formed on the exposed portion of the gate insulating layer 130 by a deposition process. The mask is then removed, thereby forming the structure shown in FIG. 8.

For another example, a support portion material layer (e.g., Al) is formed on a side of the gate insulating layer 130 facing away from the substrate 110 by using a deposition process, and then the support portion material layer is patterned to form the first support portion 141 and the second support portion 142.

Here, the first support portion and the second support portion that are patterned are in contact with the semiconductor layer respectively to define contact areas. A channel area is between the contact areas. That is, an actual channel area is defined.

As shown in FIG. 8, the first support portion 141 and the second support portion 142 are respectively on both sides of the gate 120. For example, the thickness of the first support portion 141 and the thickness of the second support portion 142 may range from 100 nm to 300 nm, respectively. For example, as shown in FIG. 8, the first support portion 141 and the gate 120 are separated by the gate insulating layer 130, and the second support portion 142 and the gate 120 are separated by the gate insulating layer 130.

In some embodiments, materials of the first support portion 141 and the second support portion 142 comprise a conductive material. That is, a material of the support portion material layer may comprise a conductive material. For example, the conductive material comprises a metal material (e.g., aluminum). The first support portion 141 may serve as a source, and the second support portion 142 may serve as a drain.

Returning to FIG. 5, at step S508, a semiconductor layer is formed on the first support portion, the second support portion, and the gate insulating layer covering the gate. The first support portion and the second support portion each are configured to support the semiconductor layer.

FIG. 1 is a schematic cross-sectional view showing a structure at step S508 during a manufacturing process of a thin film transistor according to an embodiment of the present disclosure. For example, as shown in FIG. 1, a semiconductor layer 150 (e.g., an amorphous silicon layer) 150 is formed on the first support portion 141, the second support portion 142, and the gate insulating layer 130 covering the gate 120 for example by a deposition process, and the semiconductor layer 150 is patterned.

In some embodiments, the manufacturing method may further comprise: performing an annealing treatment on the semiconductor layer 150. For example, before the semiconductor layer is annealed, a material of the semiconductor layer may comprise amorphous silicon. For example, the semiconductor layer 150 is annealed by a laser annealing process (e.g., a laser-based microlens array local crystallization technology) to convert the amorphous silicon into polysilicon. Therefore, the annealing process may crystallize the semiconductor layer. In the embodiment, the first support portion and the second support portion described above are advantageous for the semiconductor layer to be in the same focal plane of laser, thereby improving the crystallization effect of the semiconductor layer and improving the performance of the thin film transistor.

In some embodiments, by the laser annealing process, a solid solution of a metal and a semiconductor material is also formed in areas where the first support portion 141 and the second support portion 142 are in contact with the semiconductor layer 150 respectively so as to form an ohmic contact. For example, the metal materials of the first support portion 141 and the second support portion 142 comprise aluminum, and the solid solution is a solid solution of silicon and aluminum.

Here, contacts area are laser annealed to form a solid solution of a metal and a semiconductor material (e.g., a solid solution of silicon and aluminum), so that an ohmic contact is formed in a self-aligned manner here. The process of forming the ohmic contact may solve the problems such as photoresist carbonization pollution resulting from forming an ohmic contact by heavy doping in the related art.

Returning to FIG. 5, at step S510, a source and a drain each connected to the semiconductor layer are formed.

In some embodiments, the materials of the first support portion 141 and the second support portion 142 comprise a conductive material. The first support portion 141 may serve as the source, and the second support portion 142 may serve as the drain. In this case, in the case where the first support portion and the second support portion are formed, the source and the drain are formed.

So far, a manufacturing method for a thin film transistor according to some embodiments of the present disclosure is provided. In the manufacturing method, a gate is formed on a substrate. A gate insulating layer covering the gate and the substrate is formed. A first support portion and a second support portion are formed on a gate insulating layer covering the substrate and located on both sides of the gate, wherein the first support portion is not connected to the second support portion. A semiconductor layer is formed on the first support portion, the second support portion, and the gate insulating layer covering the gate. A source and a drain which are respectively connected to the semiconductor layer are formed. The first support portion and the second support portion are respectively configured to support the semiconductor layer. By forming the first support portion and the second support portion, the height difference of the gate insulating layer caused by the gate is reduced.

In addition, the use of, for example, MgO or the like as the gate insulating layer can make the gate insulating layer have a better heat insulation performance, so that during the laser annealing process, heat radiation may be performed relatively slowly, thereby improving the crystallization effect of the semiconductor layer.

In some embodiments, the first support portion and the second support portion may not serve as the source and the drain. In the case, after the annealing process, the manufacturing method may further comprise: forming a source and a drain respectively connected to the semiconductor layer.

Hereinafter, a manufacturing method for a thin film transistor according to other embodiments of the present disclosure will be described in detail in conjunction with FIG. 9 and FIG. 2.

Figure 9:
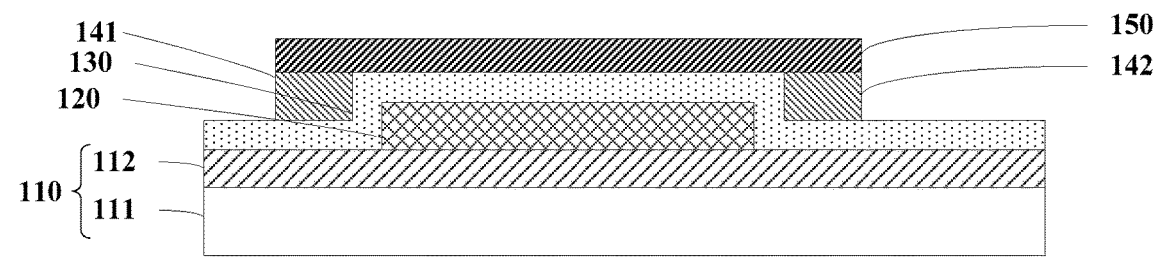
FIG. 9 is a schematic cross-sectional view showing a structure at a stage during a manufacturing process of a thin film transistor according to another embodiment of the present disclosure.

For example, a structure shown in FIG. 9 may be formed by the steps of the method shown in FIG. 5. For example, the material of the semiconductor layer 150 is amorphous silicon. In the embodiment, the materials of the first support portion 141 and the second support portion 142 may comprise a conductive material or an insulating material. The semiconductor layer 150 is then annealed, for example, to convert amorphous silicon into polysilicon.

Next, as shown in FIG. 2, a source 171 and a drain 172 connected to the semiconductor layer 150 are formed respectively. The process of forming the source and the drain will be described in detail below.

In some embodiments, after the annealing process, the manufacturing method may further comprise: doping an area of the semiconductor layer on the first support portion and an area of the semiconductor layer on the second support portion. For example, an interlayer dielectric layer 160 covering the structure shown in FIG. 9 may be formed. A material of the interlayer dielectric layer 160 may comprise at least one of silicon dioxide or silicon nitride. For example, a thickness of the interlayer dielectric layer ranges from 3000 Å to 5000 Å. The interlayer dielectric layer 160 is then etched to form two through holes exposing the semiconductor layer 150. The two through holes respectively expose the area of the semiconductor layer on the first support portion and the area of the semiconductor layer on the second support portion. The semiconductor layer 150 is doped through the two through holes.

In some embodiments, the manufacturing method may further comprise: forming a source and a drain respectively connected to the semiconductor layer in doped areas. The source and the drain form an ohmic contact with the doped areas respectively. For example, a source 171 passing through one of the two through holes and a drain 172 passing through the other through hole of the two through holes are formed by processes such as deposition and patterning. This may form the thin film transistor as shown in FIG. 2.

Figure 10:
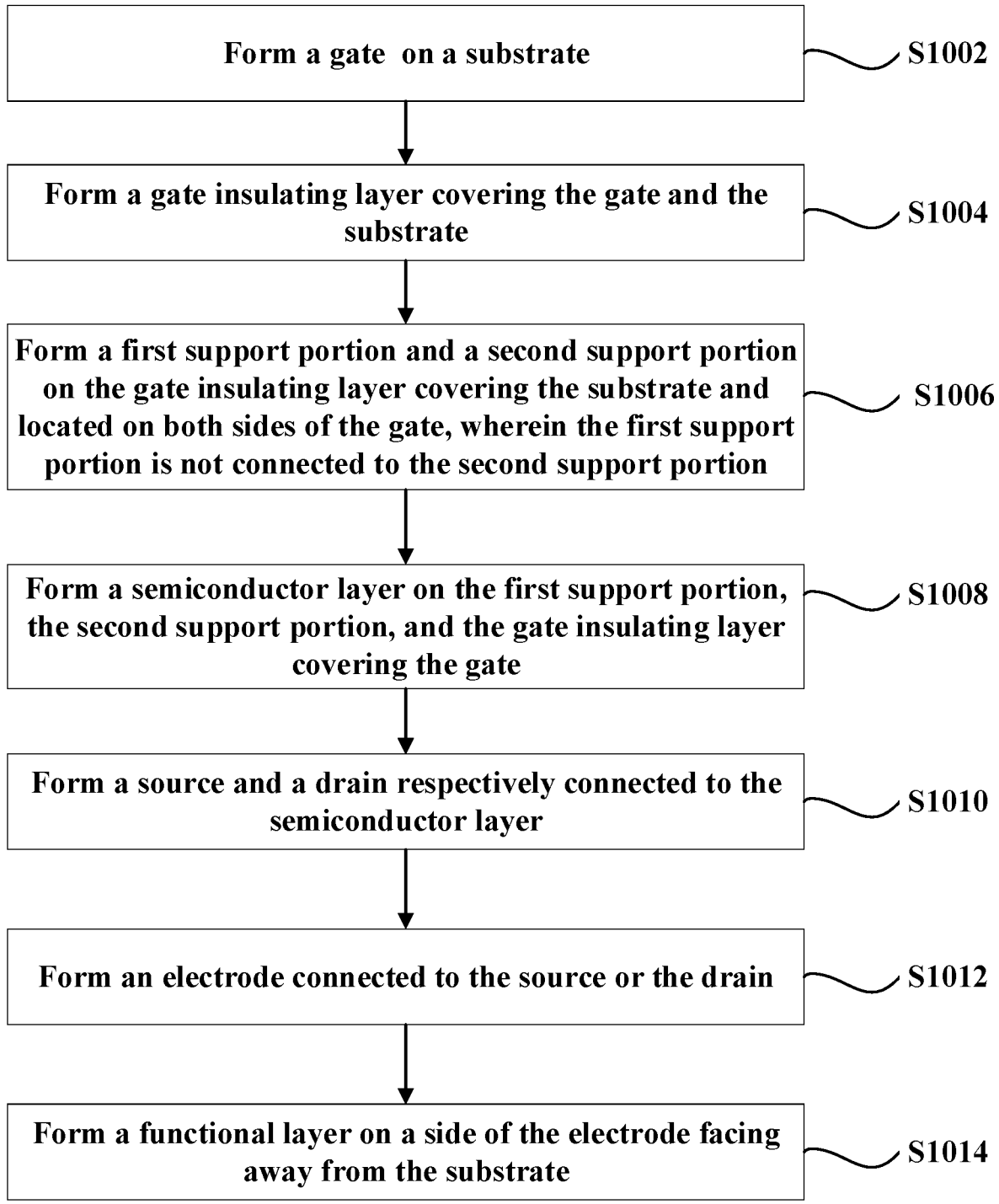
FIG. 10 is a flowchart showing a manufacturing method for a pixel structure according to an embodiment of the present disclosure.

FIG. 10 is a flowchart showing a manufacturing method for a pixel structure according to an embodiment of the present disclosure. As shown in FIG. 10, the manufacturing method comprises steps S1002 to S1014.

At step S1002, a gate is formed on a substrate. For example, a gate 120 is formed on a substrate 110 by using processes such as deposition and patterning, so as to form a structure as shown in FIG. 6.

At step S1004, a gate insulating layer covering the gate and the substrate is formed. For example, a gate insulating layer 130 covering the gate 120 and the substrate 110 is formed. A portion of the gate insulating layer 130 on the substrate 110 and a portion of the gate insulating layer 130 on the gate 120 are integrally formed. In this way, a structure shown in FIG. 7 is formed.

At step S1006, a first support portion and a second support portion are formed on the gate insulating layer covering the substrate and located on both sides of the gate, wherein the first support portion is not connected to the second support portion. For example, as shown in FIG. 9, a first support portion 141 and a second support portion 142 are formed on the gate insulating layer 130 covering the substrate 110 and located on both sides of the gate 120 by using processes such as deposition and patterning, wherein the first support portion 141 is not connected to the second support portion 142.

At step S1008, a semiconductor layer is formed on the first support portion, the second support portion, and the gate insulating layer covering the gate. For example, as shown in FIG. 9, a semiconductor layer 150 is formed on the first support portion 141, the second support portion 142, and the gate insulating layer 130 covering the gate electrode 120 by a deposition and patterning process. The first support portion 141 and the second support portion 142 each are configured to support the semiconductor layer 150.

In some embodiments, an annealing process is performed on the semiconductor layer 150.

At step S1010, a source and a drain each connected to the semiconductor layer are formed. For example, a source 171 and a drain 172 respectively connected to the semiconductor layer 150 may be formed by processes such as deposition and patterning, so as to form the structure shown in FIG. 2. For example, it is possible to first form the interlayer dielectric layer 160 covering the structure shown in FIG. 9, and then form the source 171 and the drain 172 passing through the interlayer dielectric layer 160 and connected to the semiconductor layer 150 respectively.

Figure 11:
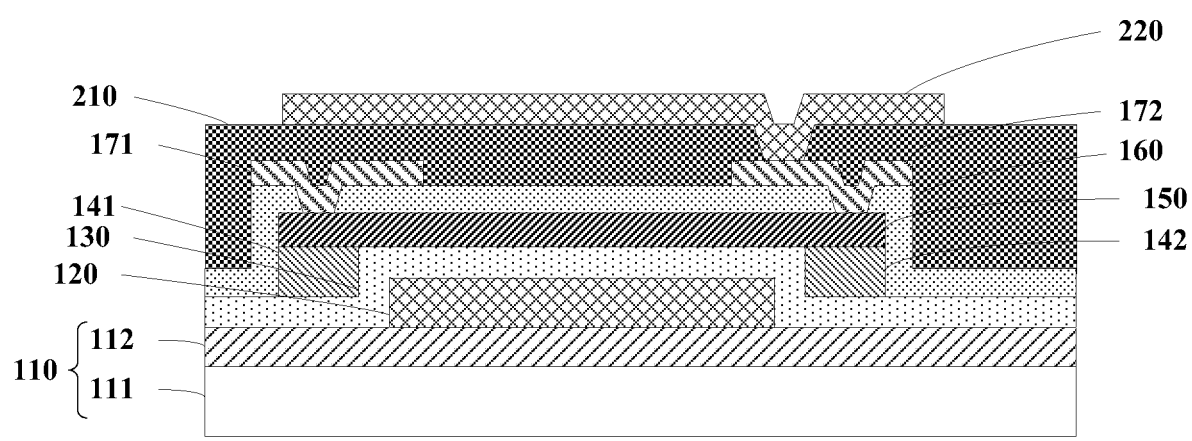
FIG. 11 is a schematic cross-sectional view showing a structure at a stage during a manufacturing process of a pixel structure according to an embodiment of the present disclosure.

At step S1012, an electrode connected to the source or the drain is formed. For example, the electrode is an anode. For example, as shown in FIG. 11, a planarization layer 210 may be formed on the structure shown in FIG. 2, so that a planarization process is performed. The planarization layer 210 is then etched to form an opening exposing the drain 172 (or the source 171). An electrode 220 passing through the opening and connected to the drain 172 (or the source 171) is formed by a process such as deposition.

At step S1014, a functional layer is formed on a side of the electrode facing away from the substrate. For example, a pixel definition layer 230 may be formed on the structure shown in FIG. 11 by using processes such as deposition and patterning, and a functional layer 240 passing through the pixel definition layer and in contact with the electrode 220 is then formed, so as to form the structure shown in FIG. 4.

In some embodiments, as shown in FIG. 4, a photo spacer 250 may be further formed on the pixel definition layer 230.

So far, a manufacturing method for a pixel structure according to some embodiments of the present disclosure is provided. In the manufacturing method, since the first support portion and the second support portion are formed, the height difference of the gate insulating layer caused by the gate is reduced, which is advantageous for the semiconductor layer to be in the same focal plane of laser, so that it is possible to improve the crystallization quality of the semiconductor layer.

Figure 12:
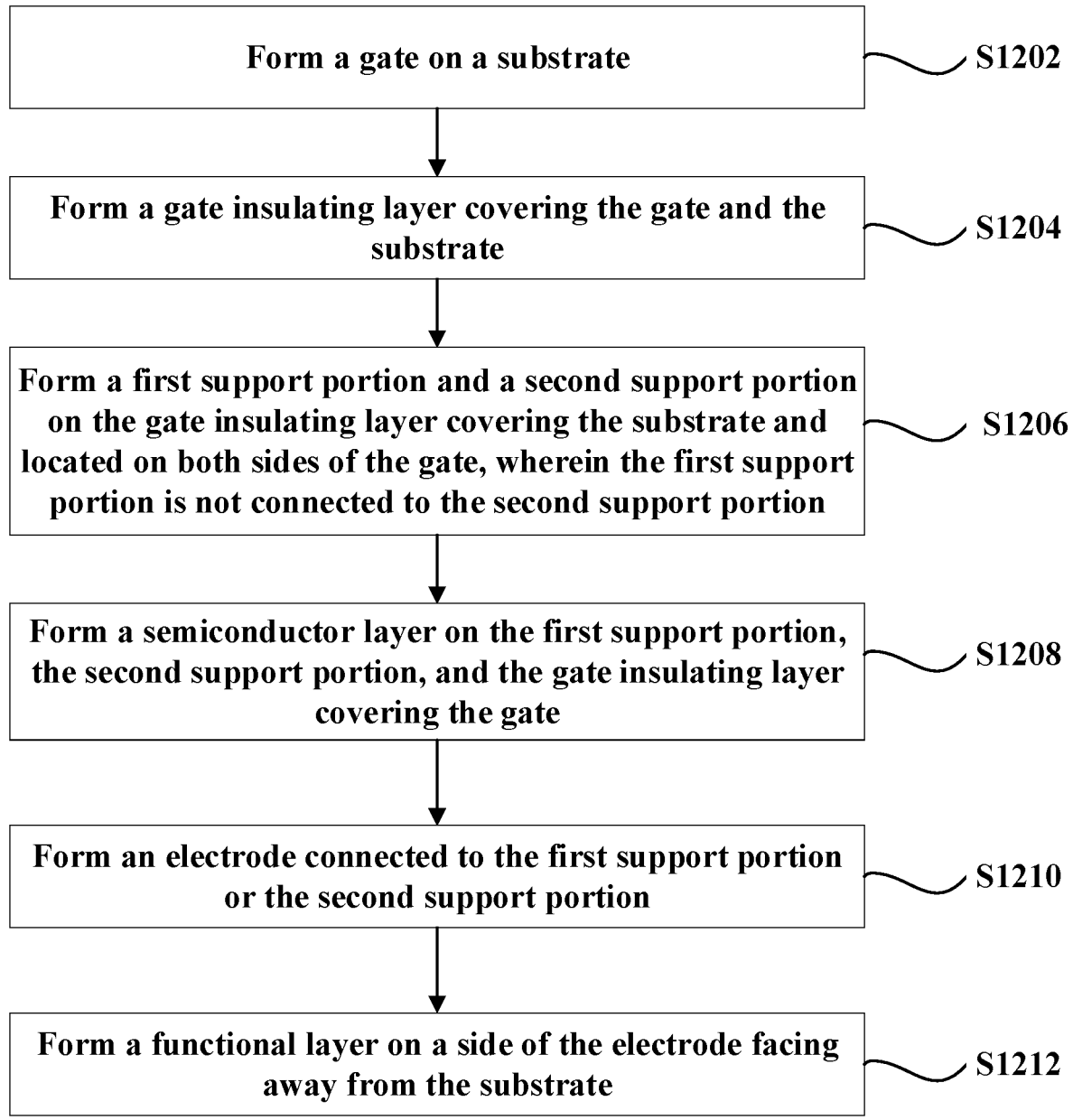
FIG. 12 is a flowchart showing a manufacturing method for a pixel structure according to another embodiment of the present disclosure.

FIG. 12 is a flowchart showing a manufacturing method for a pixel structure according to another embodiment of the present disclosure. As shown in FIG. 12, the manufacturing method may comprise steps S1202 to S1212.

At step S1202, a gate is formed on a substrate. For example, a gate 120 may be formed on a substrate 110 by using processes such as deposition and patterning, so as to form the structure as shown in FIG. 6.

In step S1204, a gate insulating layer covering the gate and the substrate is formed. For example, a gate insulating layer 130 covering the gate 120 and the substrate 110 is formed. A portion of the gate insulating layer 130 on the substrate 110 and a portion of the gate insulating layer 130 on the gate 120 are integrally formed. In this way, the structure shown in FIG. 7 is formed.

At step S1206, a first support portion and a second support portion are formed on the gate insulating layer covering the substrate and located on both sides of the gate, wherein the first support portion is not connected to the second support portion. For example, a first support portion 141 and a second support portion 142 are formed on the gate insulating layer 130 covering the substrate 110 and located on both sides of the gate 120 by using processes such as deposition and patterning, so as to form the structure as shown in FIG.

8, wherein the first support portion 141 is not connected to the second support portion 142. The first support portion 141 and the second support portion 142 are respectively on both sides of the gate 120. Materials of the first support portion 141 and the second support portion 142 may comprise a conductive material (e.g., a metal material). For example, the first support portion 141 may serve as a source, and the second support portion 142 may serve as a drain.

At step S1208, a semiconductor layer is formed on the first support portion, the second support portion, and the gate insulating layer covering the gate. For example, a semiconductor layer 150 is formed on the first support portion 141, the second support portion 142, and the gate insulating layer 130 covering the gate 120 by processes such as deposition and patterning, so as to form the structure as shown in FIG. 1. The first support portion 141 and the second support portion 142 each are configured to support the semiconductor layer 150.

In some embodiments, an annealing process is performed on the semiconductor layer 150. For example, the annealing process may crystallize the semiconductor layer. For another example, during the annealing process, a solid solution of a metal and a semiconductor material is formed in an area where the first support portion 141 and the second support portion 142 are in contact with the semiconductor layer 150 respectively, thereby forming an ohmic contact.

At step S1210, an electrode connected to the first support portion or the second support portion is formed. For example, the electrode is an anode.

Figure 13:
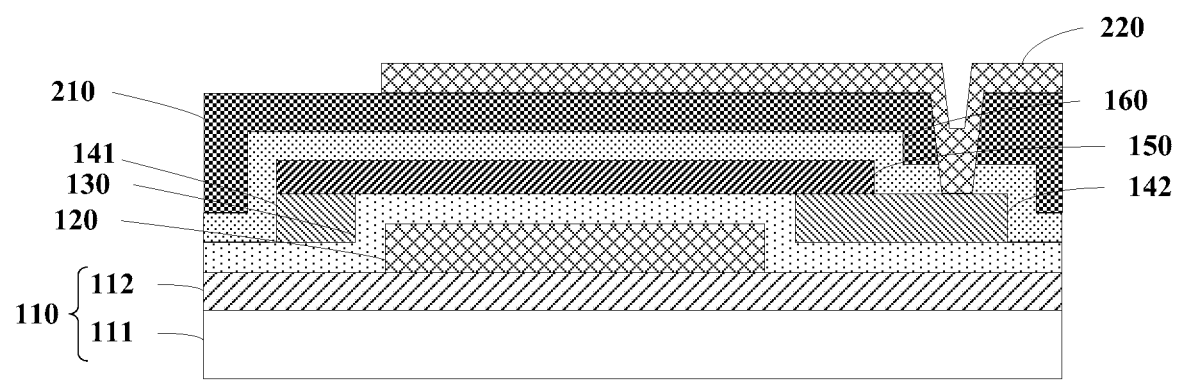
FIG. 13 is a schematic cross-sectional view showing a structure at a stage during a manufacturing process of a pixel structure according to another embodiment of the present disclosure.

For example, as shown in FIG. 13, an interlayer dielectric layer 160 may be formed on the structure shown in FIG. 1 by a process such as deposition. For example, a thickness of the interlayer dielectric layer 160 may range from 1000 Å to 3000 Å. The interlayer dielectric layer 160 is etched to form a first through hole exposing the second support portion 142 (or the first support portion 141). Next, a planarization layer 210 is formed on the interlayer dielectric layer 160. The planarization layer 210 is etched to form a second through hole, wherein the second through hole is aligned with the first through hole. Then, an electrode 220 that passes through the second through hole and the first through hole and is in contact with the second support portion 142 (or the first support portion 141) is formed by a process such as deposition.

At step S1212, a functional layer is formed on a side of the electrode facing away from the substrate.

For example, a pixel definition layer 230 may be formed on the structure shown in FIG. 13 by using processes such as deposition and patterning, and a functional layer 240 passing through the pixel definition layer 230 and in contact with the electrode 220 is then formed, so as to form the structure as shown in FIG. 3.

In some embodiments, as shown in FIG. 3, a photo spacer 250 may be further formed on the pixel definition layer 230.

So far, a manufacturing method for a pixel structure according to other embodiments of the present disclosure is provided. In the manufacturing method, since the first support portion and the second support portion are formed, the height difference of the gate insulating layer caused by the gate is reduced, which is advantageous for the semiconductor layer to be in the same focal plane of laser, thereby improving the crystallization quality of the semiconductor layer. Moreover, the first support portion may serve as a source, and the second support portion may serve as a drain, thereby simplifying the process flow.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A thin film transistor provided on a substrate, comprising:
    a gate on the substrate;
    a gate insulating layer covering the gate and the substrate;
    a first support portion and a second support portion, which are provided on the gate insulating layer covering the substrate and located on both sides of the gate, wherein the first support portion is not connected to the second support portion, and surfaces of the first support portion and the second support portion facing away from the substrate are flush with a surface of a portion of the gate insulating layer on the gate facing away from the substrate;
    a semiconductor layer on the first support portion, the second support portion, and the gate insulating layer covering the gate, wherein the semiconductor layer is on a side of the first support portion and the second support portion facing away from the substrate; and
    a source and a drain each connected to the semiconductor layer;
    wherein the first support portion and the second support portion each are configured to support the semiconductor layer.

2. The thin film transistor according to claim 1, wherein:
    the first support portion and the second support portion are provided at a step formed by the gate insulating layer on both sides of the gate, and extending directions of the first support portion and the second support portion are the same as that of the semiconductor layer.

3. The thin film transistor according to claim 2, wherein an orthographic projection of the semiconductor layer on the substrate is located inside an orthographic projection of the gate, the first support portion, and the second support portion on the substrate.

4. The thin film transistor according to claim 1, wherein the source is above the first support portion, and the drain is above the second support portion.

5. The thin film transistor according to claim 1, wherein materials of the first support portion and the second support portion comprise a conductive material,
    the first support portion serves as the source, and the second support portion serves as the drain.

6. The thin film transistor according to claim 5, wherein the conductive material comprises a metal material; and
    the first support portion and the second support portion each comprise a solid solution layer of the metal material and a semiconductor material of the semiconductor layer in areas where the first support portion and the second support portion are in contact with the semiconductor layer respectively.

7. The thin film transistor according to claim 6, wherein
the metal material comprises aluminum;
the semiconductor material of the semiconductor layer comprises polysilicon; and
the solid solution layer is a solid solution layer of silicon and aluminum.

8. The thin film transistor according to claim 1, wherein a material of the gate insulating layer comprises MgO.

9. A pixel structure, comprising:
the thin film transistor according to claim 1.

10. An array substrate, comprising the thin film transistor according to claim 1.

11. A display device, comprising the array substrate according to claim 10.

12. A manufacturing method for a thin film transistor, comprising:
forming a gate on a substrate;
forming a gate insulating layer covering the gate and the substrate;
forming a first support portion and a second support portion on the gate insulating layer covering the substrate and located on both sides of the gate, wherein the first support portion is not connected to the second support portion, and surfaces of the first support portion and the second support portion facing away from the substrate are flush with a surface of a portion of the gate insulating layer on the gate facing away from the substrate;
forming a semiconductor layer on the first support portion, the second support portion, and the gate insulating layer covering the gate, wherein the semiconductor layer is on a side of the first support portion and the second support portion facing away from the substrate; and
forming a source and a drain each connected to the semiconductor layer;
wherein the first support portion and the second support portion each are configured to support the semiconductor layer.

13. The manufacturing method according to claim 12, further comprising:
performing an annealing treatment on the semiconductor layer.

14. The manufacturing method according to claim 13, wherein after performing the annealing treatment, the manufacturing method further comprises:
doping an area of the semiconductor layer on the first support portion and an area of the semiconductor layer on the second support portion; and
forming the source and the drain respectively connected to the semiconductor layer in respective doped areas, wherein the source and the drain respectively form an ohmic contact with the respective doped areas.

15. The manufacturing method according to claim 13, wherein
materials of the first support portion and the second support portion comprise a conductive material, the first support portion serves as the source, and the second support portion serves as the drain.

16. The manufacturing method according to claim 15, wherein
the conductive material comprises a metal material;
before performing the annealing treatment on the semiconductor layer, a semiconductor material of the semiconductor layer comprises amorphous silicon; and
the performing the annealing treatment on the semiconductor layer comprises: annealing the semiconductor layer by a laser annealing process to convert the amorphous silicon into polysilicon,
wherein, by the laser annealing process, a solid solution layer of the metal material and the semiconductor material is also formed in areas where the first support portion and the second support portion are in contact with the semiconductor layer respectively so as to form an ohmic contact.

17. The manufacturing method according to claim 16, wherein
the metal material comprises aluminum; and
the solid solution layer is a solid solution layer of silicon and aluminum.

* * * * *